US012654591B2

(12) United States Patent
Kiyoshige et al.

(10) Patent No.: US 12,654,591 B2
(45) Date of Patent: Jun. 16, 2026

(54) BATTERY CONTROL SYSTEM

(71) Applicant: TOYOTA JIDOSHA KABUSHIKI KAISHA, Toyota (JP)

(72) Inventors: Sho Kiyoshige, Nisshin (JP); Masaki Sugiura, Seto (JP); Masaaki Kyo, Nisshin (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 233 days.

(21) Appl. No.: 18/422,357

(22) Filed: Jan. 25, 2024

(65) Prior Publication Data

US 2024/0336160 A1     Oct. 10, 2024

(30) Foreign Application Priority Data

Apr. 5, 2023     (JP) .................................. 2023-061510

(51) Int. Cl.
| | |
|---|---|
| *B60L 58/16* | (2019.01) |
| *B60L 58/14* | (2019.01) |
| *G01R 31/392* | (2019.01) |
| *H01M 10/42* | (2006.01) |
| *H02J 7/00* | (2026.01) |
| *H02J 7/84* | (2026.01) |

(52) U.S. Cl.
CPC .............. *B60L 58/16* (2019.02); *B60L 58/14* (2019.02); *G01R 31/392* (2019.01); *H01M 10/425* (2013.01); *H02J 7/84* (2026.01); *H02J 7/855* (2026.01); *B60L 2240/545* (2013.01); *H01M 2010/4278* (2013.01); *H01M 2220/20* (2013.01)

(58) Field of Classification Search
CPC .... G07C 5/008; G07C 5/0808; G05D 1/0022; G05D 1/0088; G05D 2201/0213; B60L 58/16; B60L 58/14; B60L 2240/545; G01R 31/392; H01M 10/425; H01M 2010/4278; H01M 2220/20; H01M 10/48; H01M 10/486; H02J 7/005; H02J 7/0063; Y02E 60/10
See application file for complete search history.

(56) References Cited

U.S. PATENT DOCUMENTS

| | | |
|---|---|---|
| 2016/0252582 A1 | 9/2016 | Iida et al. |
| 2019/0120909 A1* | 4/2019 | Koizumi ................... H02J 7/14 |
| 2021/0408616 A1 | 12/2021 | Ogaki et al. |

FOREIGN PATENT DOCUMENTS

| | | |
|---|---|---|
| JP | 2015-108579 A | 6/2015 |
| JP | 2019-078571 A | 5/2019 |
| JP | 2022-011148 A | 1/2022 |

* cited by examiner

*Primary Examiner* — Anne Marie Antonucci
*Assistant Examiner* — Jingli Wang
(74) *Attorney, Agent, or Firm* — SoraIP, Inc.

(57) ABSTRACT

A battery that supplies power to an electrical load mounted on a vehicle, an information acquisition device that acquires the number of times a specific discharge has occurred from the battery and the time the vehicle has been used, and a specific discharge of the battery acquired by the information acquisition device. This battery control system includes a battery deterioration determination device that determines whether the battery is in a deterioration state due to grid corrosion or in a deterioration state due to active material softening based on the number of times and vehicle usage time.

9 Claims, 5 Drawing Sheets

BATTERY CONTROL SYSTEM

CROSS-REFERENCE TO RELATED APPLICATION

This application claims priority to Japanese Patent Application No. 2023-061510 filed on Apr. 5, 2023, incorporated herein by reference in its entirety.

BACKGROUND

1. Technical Field

The present disclosure relates to a battery control system for a vehicle.

2. Description of Related Art

Japanese Unexamined Patent Application Publication No. 2022-011148 (JP 2022-011148 A) discloses a battery management support device that can appropriately manage a battery of an electrified vehicle. This battery management support device suppresses battery deterioration by appropriately controlling battery cooling based on battery temperature information.

SUMMARY

The main causes of battery deterioration are "grid corrosion" that is corrosion of a cathode electrode grid and "active material softening" that is softening and falling of a cathode active material. Regarding the grid corrosion, it is known that the deterioration progresses depending on a battery liquid temperature, and the battery voltage gradually decreases as the deterioration progresses. By monitoring the battery liquid temperature and the voltage, it is possible to easily predict and detect the deterioration due to the grid corrosion. Regarding the active material softening, it is known that the deterioration progresses as the battery is repeatedly discharged, but a noticeable drop in battery voltage does not appear until the battery reaches the end of its life. Therefore, it is difficult to predict and detect the deterioration due to the active material softening by only monitoring the battery voltage.

The present disclosure has been made in view of the above problem, and has an object to provide a battery control system that can easily predict and detect deterioration due to active material softening of a battery.

In order to solve the above problem, a battery control system according to an aspect of the disclosed technology includes:

a battery configured to supply electric power to an electrical load mounted on a vehicle;

an information acquisition device configured to acquire a specific discharge count of the battery and a use period of the vehicle; and a battery deterioration determination device configured to determine whether the battery has deteriorated due to grid corrosion or active material softening based on the specific discharge count of the battery and the use period of the vehicle that are acquired by the information acquisition device.

With the battery control system of the present disclosure, it is possible to easily predict and detect the deterioration due to the active material softening of the battery by acquiring the specific discharge count of the battery and the use period of the vehicle. Thus, it is possible to reduce the occurrence of a case where the battery is dead.

BRIEF DESCRIPTION OF THE DRAWINGS

Features, advantages, and technical and industrial significance of exemplary embodiments of the disclosure will be described below with reference to the accompanying drawings, in which like signs denote like elements, and wherein.

DETAILED DESCRIPTION OF EMBODIMENTS

The battery control system of the present disclosure obtains the number of deep battery discharges and vehicle usage time that affect battery deterioration. Based on these, it is determined whether the battery is deteriorating due to grid corrosion or due to softening of the active material. Through this process, deterioration due to softening of the battery's active material can be easily detected, and the occurrence of dead battery can be suppressed.

Hereinafter, an embodiment of the present disclosure will be described in detail with reference to the drawings.

Embodiment

Configuration

Figure 1:
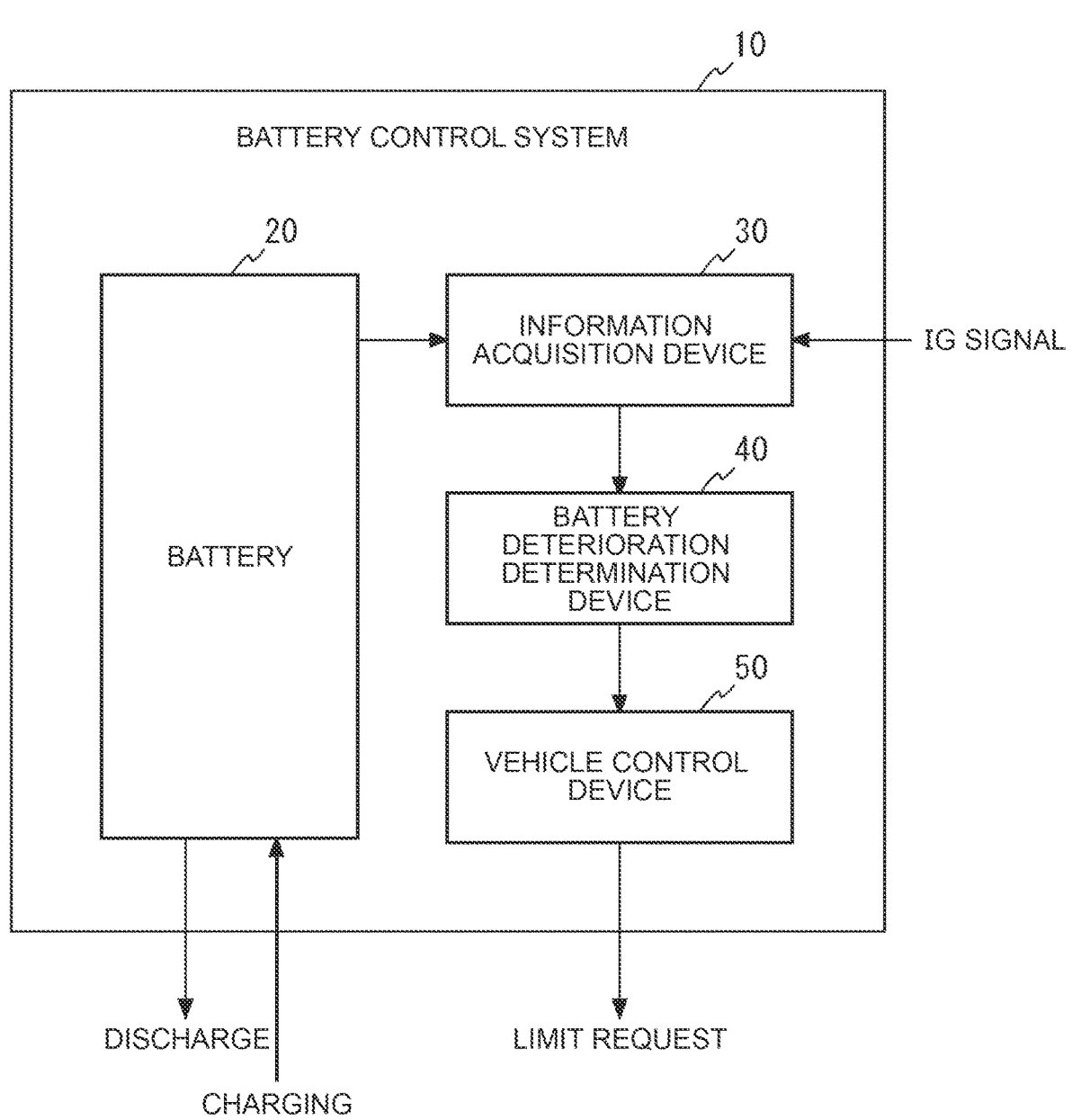
FIG. 1 is a schematic configuration diagram of a battery control system according to an embodiment of the present disclosure.

FIG. 1 is a schematic diagram for explaining a configuration example of a battery control system 10 according to an embodiment of the present disclosure. The battery control system 10 illustrated in FIG. 1 includes a battery 20, an information acquisition device 30, a battery deterioration determination device 40, and a vehicle control device 50. This battery control system 10 is mounted on, for example, a vehicle.

The battery 20 is a secondary battery configured to be chargeable and dischargeable, such as a lead acid battery or a lithium ion battery. This battery 20 can supply (discharge) power necessary for an auxiliary electrical load (not shown) other than for driving the vehicle. Further, the battery 20 can receive power supply (charge) from a main electrical load (not shown) for driving the vehicle. As the battery 20, a so-called auxiliary battery can be exemplified.

The information acquisition device 30 is configured to acquire various information regarding the vehicle. The information acquisition device 30 of the present embodiment records the number of specific discharges performed from the battery 20 to an auxiliary electrical load mounted on the vehicle, and the time period during which the vehicle was used. Obtain at least data on how the vehicle is used.

Here, the specific discharge in this embodiment refers to a large (deep) discharge in which the depth of discharge (DOD) is greater than or equal to a predetermined threshold. As an example, 5% of the storage rate (SOC) of the battery 20 can be set as the predetermined threshold value. The information acquisition device 30 acquires, based on information given by various sensors included in the battery 20, an electronic control unit (ECU), and the like (not shown) that monitors the state of the battery 20, the specific number of times of discharge by the battery 20 (hereinafter referred to as "the number of times of deep discharge of the battery").

In addition, the time the vehicle has been used is the period from the time when the ignition switch of the vehicle transitions from the off state (IG-OFF) to the on state (IG-ON) until the on state changes back to the off state, i.e. This is the time period during which the ignition switch of the vehicle is in the on state. The information acquisition device 30 can acquire the time during which the vehicle was used (hereinafter referred to as "vehicle usage time") based on an ignition signal (IG signal) transmitted and received within the vehicle.

The information acquisition device 30 stores the acquired vehicle usage data (the number of deep discharges of the battery, the usage time of the vehicle) in a predetermined storage unit (not shown) or the like. More specifically, the information acquisition device 30 accumulates the number of deep discharges that exceed a predetermined threshold that occur in the battery 20 during the usage time of the vehicle. The information acquisition device 30 of this embodiment manages the usage time of the vehicle on a daily basis (divided from 0:00 to 24:00), and calculates the total number of deep discharges on a daily basis. For example, on one day, information may be acquired in which one deep discharge occurs during a ride from 7:00 to 8:00, no deep discharge occurs during a ride from 12:00 to 13:00, and a deep discharge occurs twice during a ride from 18:00 to 20:00. In that case, "vehicle usage time: 4 hours (=1+1+2)" and "number of deep battery discharges: 3 times (=1+0+2)" are stored as a pair of information for the day.

The battery deterioration determination device 40 is configured to determine whether the battery 20 is in a deterioration state due to grid corrosion or in a deterioration state due to active material softening. In making this determination, the battery deterioration determination device 40 of this embodiment determines a deterioration mode determination line and derives the usage status of the battery 20.

Figure 2:
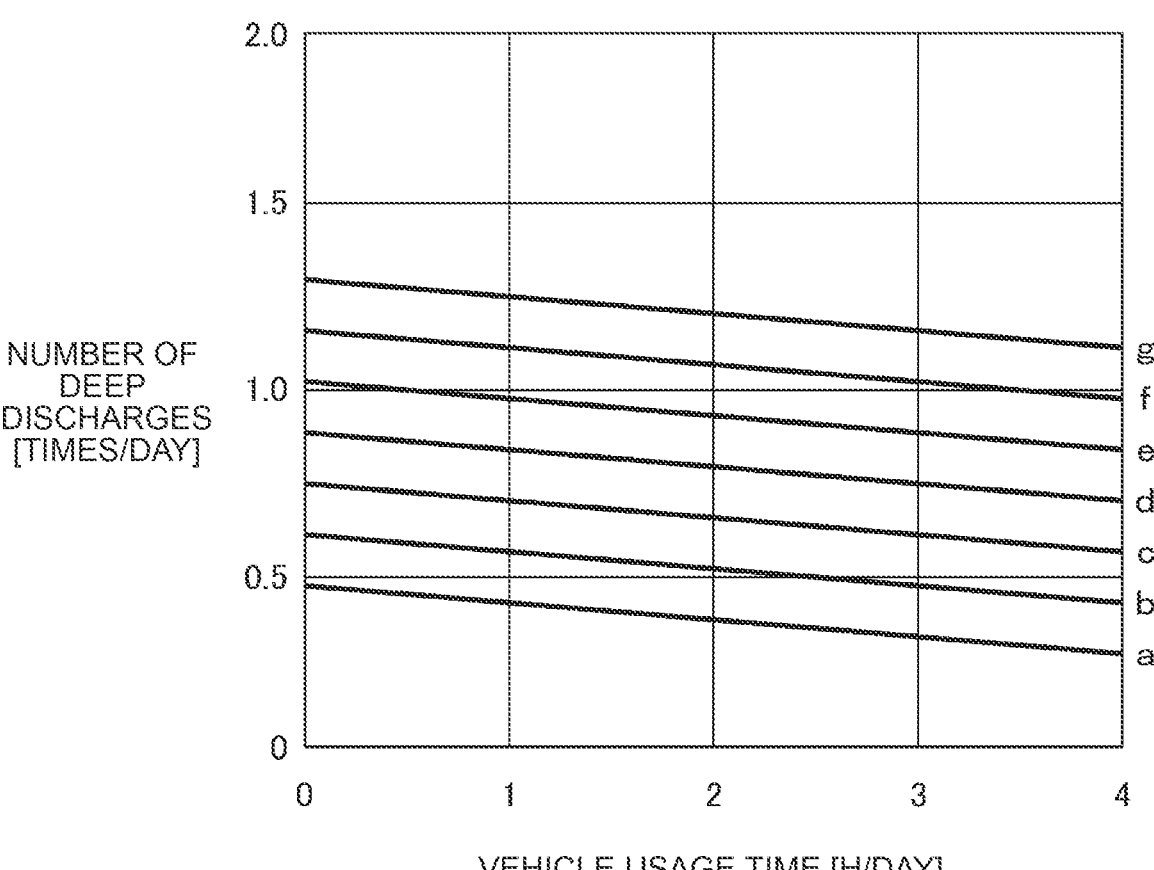
FIG. 2 is an example of a deterioration mode determination line held by the battery deterioration determination device.

Here, the deterioration mode determination line is a determination line that is a threshold value for determining whether the battery 20 is in a deterioration state due to lattice corrosion or in a deterioration state due to active material softening. A plurality of deterioration mode determination lines is set in advance according to the number of occurrences of deep discharge based on the capacity and performance of the battery 20, vehicle specifications, etc., and each deterioration mode determination line is typically Represented by a linear straight line weighted according to frequency. FIG. 2 shows an example in which seven deterioration mode determination lines a to g are set according to the daily average number of deep discharges.

The battery deterioration determination device 40 determines the number of deep discharges of the battery from among vehicle usage data accumulated in a storage unit (not shown) up to now (from when the battery 20 was new (when replaced) to the present time). Based on this, one of the plurality of deterioration mode determination lines to be used for determining the deterioration mode of the battery 20 is determined. For example, in FIG. 2, if the average number of deep discharges of the battery per day is relatively small, one of the deterioration mode determination lines a to d is determined depending on the number of times. If the average number of deep discharges of the battery per day is relatively large, one of the deterioration mode determination lines e to g may be determined depending on the number of times.

Note that the deterioration mode determination line may be determined based on the average value of the liquid temperature of the battery 20 during the period when the vehicle is used (IG-ON) in addition to the number of deep discharges of the battery. The liquid temperature of the battery 20 can be acquired by the information acquisition device 30 as vehicle usage data.

Furthermore, the battery deterioration determination device 40 derives, as the usage status of the battery 20, the number of times at which deep discharge of the battery 20 occurs to the average usage time of the vehicle per day, based on the vehicle usage data accumulated in a predetermined storage unit (not shown) or the like. For example, the information on the first day is "vehicle usage time: 3 hours" and "the number of times of battery deep discharge: once", the information on the second day is "vehicle usage time: 1.5 hours" and "the number of times of battery deep discharge: once", the information on the third day is "vehicle usage time: 2 hours" and "the number of times of battery deep discharge: 0 times", the information on the fourth day is "vehicle usage time: 4 hours" and "the number of times of battery deep discharges: once", and the information on the fifth day is "vehicle usage time: 1 hour" and "the number of time of battery deep discharge: 0 times". In this case, after using the vehicle for 5 days, the average daily usage time is "Vehicle usage time: 2.3 hours (=(3+1.5+2+4+1)/5)" and "Number of battery deep discharges: 0.8 times. (=(1+2+0+1+0)/5)" are derived as the usage status of the battery 20.

Then, the battery deterioration determination device 40 determines whether the battery 20 is in a deterioration state due to lattice corrosion or deterioration due to active material softening, based on the determination of the determined deterioration mode determination line and the derived usage status of the battery 20. It is determined whether This determination method will be described later.

The vehicle control device 50 is configured to request the vehicle to limit discharging from the battery 20 when the battery deterioration determination device 40 determines that the battery 20 is in a deteriorated state due to softening of the active material. be. The request to limit discharge is typically aimed at suppressing deterioration of the battery 20, and is intended to prevent the vehicle from having to perform a large (deep) discharge where the depth of discharge exceeds a predetermined threshold. This is a request to instruct control. For example, effectively restricting vehicle control within a range that does not affect safe driving of the vehicle is exemplified, such as prohibiting the act of forcibly discharging the battery 20 in order to efficiently acquire regenerated power. This request to limit discharge is output to a predetermined control system or control device installed in the vehicle that is capable of limiting discharge.

Note that the vehicle control device 50 may notify the user of the vehicle that a request to limit discharging from the battery 20 has been made to the vehicle. This notification may be made at the same timing as the restriction request, or may be made at a different timing.

Part or all of the information acquisition device 30, battery deterioration determination device 40, and vehicle control device 50 in the battery control system 10 described above typically includes a processor such as a microcomputer, a memory, an input/output interface, etc. They may be configured as more than one electronic control unit (ECU). This electronic control device can realize some or all of the functions of the information acquisition device 30, battery deterioration determination device 40, and vehicle control device 50 described above by having a processor read and execute a program stored in the memory.

Control

Figure 3:
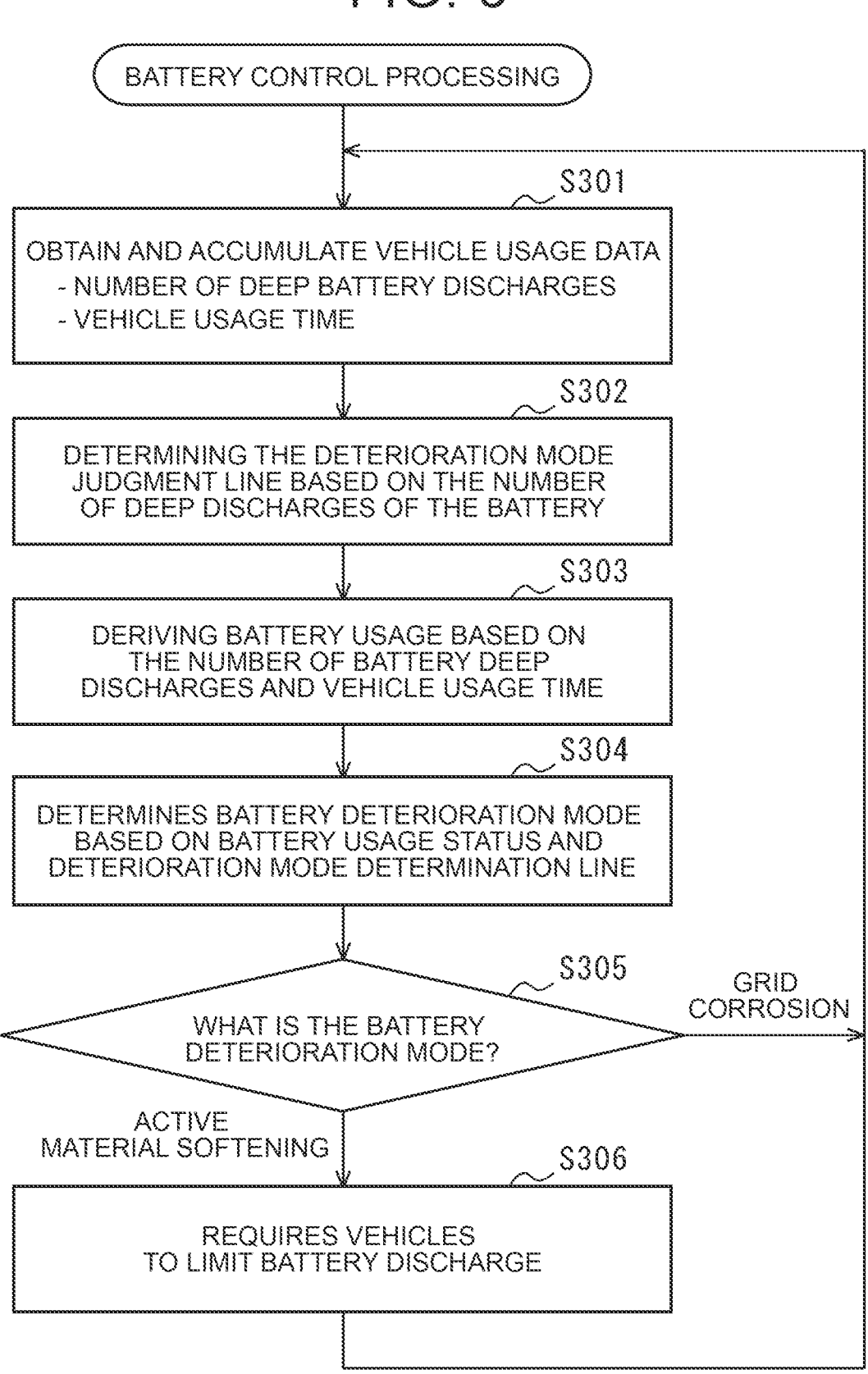
FIG. 3 is a flowchart of battery control processing executed by the battery control system.
Figure 4A:
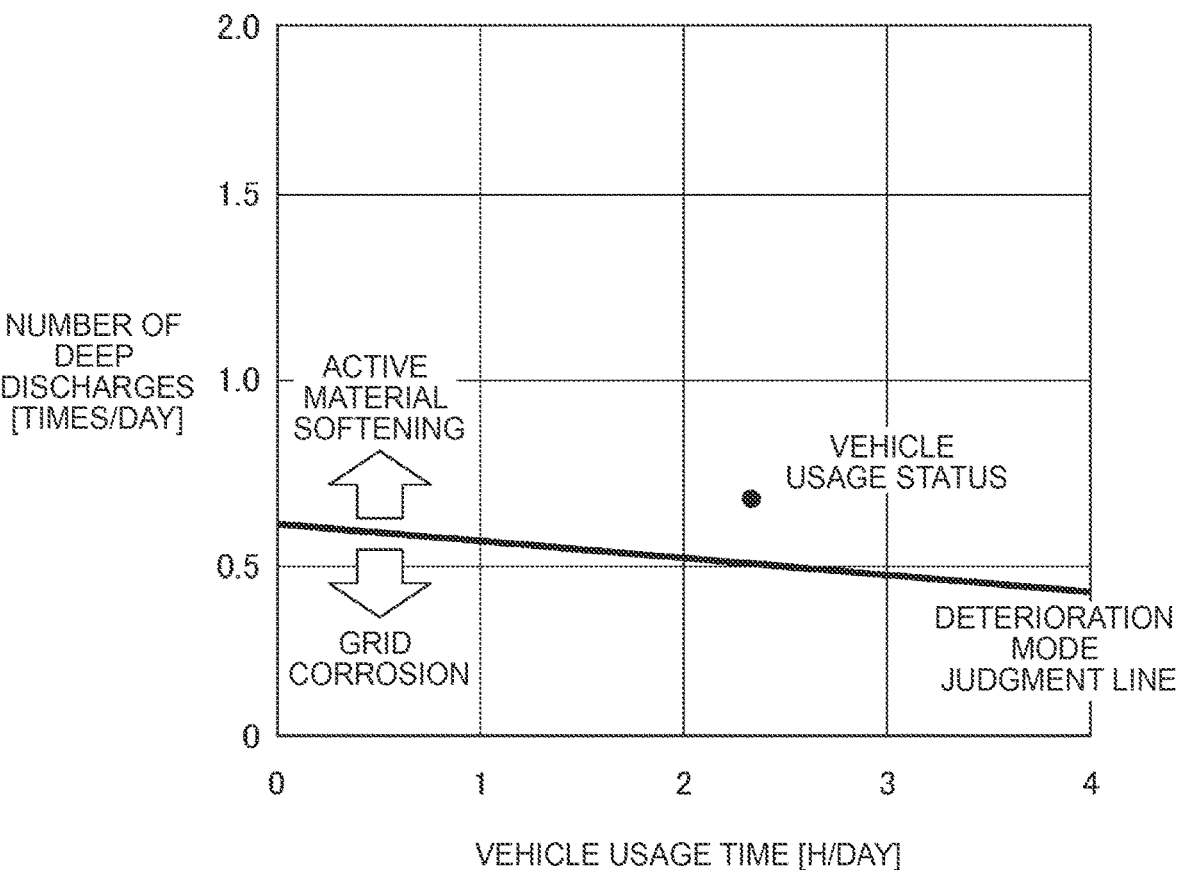
FIG. 4A is an example image when determining the deterioration mode to be the active material softening mode.
Figure 4B:
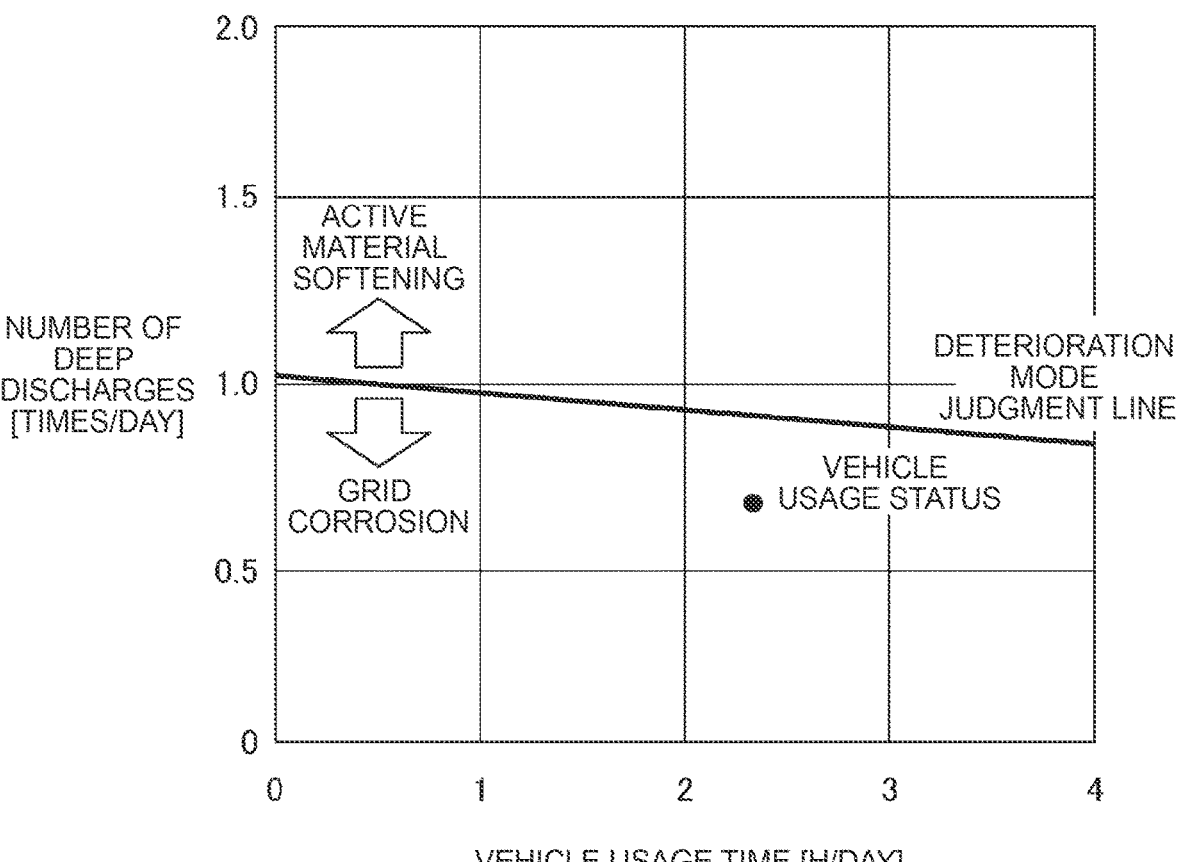
FIG. 4B is an example image when the deterioration mode is determined to be the lattice corrosion mode.

Next, with further reference to FIG. 3, FIG. 4A, and FIG. 4B, the control executed by the battery control system 10 according to the present embodiment will be described. FIG. 3 is a flowchart illustrating the procedure of battery control processing executed by the information acquisition device 30, the battery deterioration determination device 40, and the vehicle control device 50. FIGS. 4A and 4B are conceptual diagrams in which the battery deterioration determination device 40 determines the deterioration mode of the battery 20.

S301

The information acquisition device 30 acquires the number of deep discharges of the battery and the usage time of the vehicle as data on how the vehicle is used, and stores it in a storage unit or the like. Acquisition of vehicle usage data is performed during a period when an ignition signal (IG signal) is in an on state (IG-ON). Accumulation of vehicle usage data is typically performed at the timing when an ignition signal (IG signal) is turned off (IG-OFF). Once the vehicle usage data is acquired and accumulated by the information acquisition device 30, the process proceeds to S302.

S302

The battery deterioration determination device 40 refers to vehicle usage data stored in a storage unit or the like, and determines a deterioration mode determination line for use in determining the deterioration mode of the battery 20 based on the number of deep discharges of the battery. This deterioration mode determination line for determining the deterioration mode is determined by selecting one appropriate deterioration mode determination line according to the number of deep discharges of the battery from among a plurality of deterioration mode determination lines prepared in advance. When the battery deterioration determination device 40 determines a deterioration mode determination line for deterioration mode determination, the process advances to S303.

S303

The battery deterioration determination device 40 refers to vehicle usage data stored in a storage unit, etc., and derives the usage status of the vehicle 20 that correlates the average daily vehicle usage time in the data stored to date with the number of deep discharges of the battery. When the current usage status of the battery 20 is derived by the battery deterioration determination device 40, the process advances to S304.

S304

The battery deterioration determination device 40 determines the deterioration mode of the battery 20 based on the deterioration mode determination line determined in S302 above and the usage status of the battery 20 derived in S303 above. This deterioration mode determination is performed based on the positional relationship of the usage status of the battery 20 with respect to the deterioration mode determination line. The positional relationship of the usage status of the battery 20 is obtained plotting the mode determination line and the usage status of the battery 20 on a map (deterioration mode determination map) where the horizontal axis is the average daily vehicle usage time and the vertical axis is the average number of deep discharges of the battery per day. When the battery deterioration determination device 40 determines the deterioration mode of the battery 20, the process advances to S305.

S305

The battery deterioration determination device 40 determines whether the deterioration of the battery 20 is in the lattice corrosion mode due to corrosion of the positive electrode lattice, or whether the deterioration of the battery 20 is due to active material softening due to softening of the positive electrode active material, as a result of the deterioration mode determination performed in S304. mode. For example, as shown in FIG. 4A, when the usage status (black circle mark) of the battery 20 is in the area above the deterioration mode determination line (solid line) in the deterioration mode determination map, it is determined that the active material softening mode is active. Ru. For example, as shown in FIG. 4B, when the usage status of the battery 20 is in a region below the deterioration mode determination line in the deterioration mode determination map, it is determined that the battery is in the grid corrosion mode.

When the battery deterioration determination device 40 determines that the battery 20 is degraded in the active material softening mode (S305, active material softening), the process proceeds to S306. On the other hand, when the battery deterioration determination device 40 determines that the battery 20 is degraded in the grid corrosion mode (S305, grid corrosion), the process proceeds to S301.

S306

The vehicle control device 50 makes a request (restriction request) to a predetermined device or system in the vehicle to limit discharging from the battery 20. Furthermore, the vehicle control device 50 may notify the user of the vehicle that a request to limit this discharge has been made. When the vehicle control device 50 makes a request to limit discharging from the battery 20, the process advances to S301.

Note that there is no particular regulation regarding the timing of executing each of the processes from S302 to S306 above, but typically, it is desirable that the processes from S302 to S306 are executed when the ignition signal (IG signal) is turned on (IG-ON) and the vehicle is ready for use (driving).

Operations and Effects

As described above, according to the battery control system 10 according to an embodiment of the present disclosure, based on the number of deep discharges that affect the deterioration of the battery 20 from the battery 20 that supplies power to an on-vehicle electrical load, and the vehicle usage time, it is determined whether the battery 20 is in a degraded state due to lattice corrosion or in a degraded state due to active material softening. Through this process, it becomes possible to easily predict and detect the deterioration of the battery 20 due to softening of the active material, and it is possible to suppress the occurrence of a dead battery.

Although one embodiment of the present disclosure has been described above, the present disclosure includes not only a battery control system, but also a control method executed by the battery control system including a processor and a memory, and a control program for executing this control method, a computer-readable non-transitory storage medium storing a control program, and a vehicle equipped with a battery control system.

The battery control system of the present disclosure can be used when it is desired to easily predict or detect deterioration due to softening of the active material of a battery mounted on a vehicle.

What is claimed is:

1. A battery control system comprising:

a battery configured to supply electric power to an electrical load mounted on a vehicle; and a first processor configured to;

acquire the number of a specific discharge of the battery and a use period of the vehicle, the specific discharge being a discharge in which a depth of discharge of the battery is greater than or equal to a predetermined threshold;

calculate (i) an average daily vehicle usage time based on the acquired use period of the vehicle and (ii) an average number of the specific discharge per day based on the acquired number of the specific discharge;

determine, based on the average number of the specific discharge, a first deterioration mode determination line among a plurality of deterioration mode determination lines, each of the plurality of deterioration mode determination lines being defined by the average number of the specific discharge and the average daily vehicle usage time of the vehicle;

determine whether a plot is below the first deterioration mode determination line on a map where a horizontal axis is the average daily vehicle usage time and a vertical axis is the average number of the specific discharge, the plot be determined by the average daily vehicle usage time and the average number of the specific discharge;

determine that the battery has deteriorated due to active material softening based on determining that the plot is below the first deterioration mode determination line; and request a second processor of the vehicle to limit discharge from the battery based on determining that the battery has deteriorated due to the active material softening.

2. The battery control system according to claim 1, wherein the first processor is further configured to acquire, as the use period of the vehicle, a period in which an ignition switch of the vehicle is ON.

3. The battery control system according to claim 2, wherein:

the predetermined threshold is 5% of a storage rate of the battery; and the first processor is further configured to:

determine, based on the average number of the specific discharge and an average value of a liquid temperature of the battery during the use period of the vehicle, the first deterioration mode determination line among the plurality of deterioration mode determination lines when an ignition signal is turned on;

prohibit a forcible discharge of the battery when the ignition signal is turned on; and notify a user of the vehicle of the forcible discharge of the battery.

4. The battery control system according to claim 1, wherein the predetermined threshold is 5% of a storage rate of the battery.

5. The battery control system according to claim 1, wherein the first processor is further configured to prohibit a forcible discharge of the battery to achieve efficient regenerated power.

6. The battery control system according to claim 5, wherein the first processor is further configured to prohibit the forcible discharge of the battery in a case where an ignition signal is turned on.

7. The battery control system according to claim 1, wherein the first processor is further configured to determine, based on the average number of the specific discharge and an average value of a liquid temperature of the battery during the use period of the vehicle, the first deterioration mode determination line among the plurality of deterioration mode determination lines.

8. The battery control system according to claim 7, wherein the first processor is further configured to determine the first deterioration mode determination line when an ignition signal is turned on.

9. The battery control system according to claim 1, wherein the first processor is further configured to notify a user of the vehicle that a request to limit the discharge from the battery has been made to the vehicle.

* * * * *